(12) United States Patent
Pisek

(10) Patent No.: US 7,496,827 B2
(45) Date of Patent: Feb. 24, 2009

(54) SYSTEM AND METHOD FOR MULTI-MODE MULTI-STATE PATH METRIC ADDRESSING

(75) Inventor: Eran Pisek, Plano, TX (US)

(73) Assignee: Samsung Electronics Co., Ltd., Suwon-si (KR)

(*) Notice: Subject to any disclaimer, the term of this patent is extended or adjusted under 35 U.S.C. 154(b) by 496 days.

(21) Appl. No.: 11/317,448

(22) Filed: Dec. 23, 2005

(65) Prior Publication Data

US 2006/0195770 A1    Aug. 31, 2006

Related U.S. Application Data

(60) Provisional application No. 60/730,071, filed on Oct. 25, 2005, provisional application No. 60/682,338, filed on May 18, 2005, provisional application No. 60/682,339, filed on May 18, 2005, provisional application No. 60/653,968, filed on Feb. 17, 2005.

(51) Int. Cl.
*H03M 13/00* (2006.01)
(52) U.S. Cl. ...................................... 714/792
(58) Field of Classification Search ......... 714/794–796; 375/262, 341
See application file for complete search history.

(56) References Cited

U.S. PATENT DOCUMENTS 5,923,713 A * 7/1999 Hatakeyama ................ 375/341
7,020,214 B2 * 3/2006 Bickerstaff ................. 375/265
2004/0255230 A1 * 12/2004 Chen et al. ................. 714/796

OTHER PUBLICATIONS

Author unknown; *How to Implement a Viterbi Decoder on the StarCore SC140*; "Convolutional Encoding and Viterbi Decoding"; Chapter 2, pp. 3-27.
Turbo Code Project Page; http:// faraday.ee.emu.edu.tr/eaince/ee562/Public/sova.htm; 6 pages; retrieved Oct. 25, 2005.
"Turbo-decoding" of error-correcting codes using belief networks/graphical models; http//www.datalab.uci.edu/projects/turbocode/; 3 pages; retrieved Oct. 25, 2005.
Turbo code; http://en.wikipedia.org/wiki/Turbo_code; 3 pages; retrieved Oct. 25, 2005.
Viterbi algorithm; http//en.wikipedia.org/wiki/Viterbi_algorithm; 4 pages; retrieved Oct. 25, 2005.

* cited by examiner

*Primary Examiner*—Shelly A Chase

(57) ABSTRACT

A wireless communication device comprises a first memory unit operable to store current and next stage memory low data of a path metric calculation of a trellis-based decoding processor, a second memory unit operable to store current and next stage memory high data of the path metric calculation of the trellis-based decoding processor, and wherein the trellis-based decoding processor is operable for multiple decoding constraint lengths and multiple states.

29 Claims, 7 Drawing Sheets

SYSTEM AND METHOD FOR MULTI-MODE MULTI-STATE PATH METRIC ADDRESSING

RELATED APPLICATIONS

This application claims the benefit of U.S. Provisional Patent No. 60/653,968 filed on Feb. 17, 2005 and entitled "Context-Based Operation Reconfigurable Instruction Set Processor," Provisional Patent Application No. 60/682,338 filed on May 18, 2005 and entitled "Turbo Code Decoder Architecture For Software-Defined Radio," Provisional Patent Application No. 60/682,339 filed on May 18, 2005 and entitled "Viterbi Decoder Architecture For Software-Defined Radio," and Provisional Patent Application No. 60/730,071 filed on Oct. 25, 2005 and entitled "System and Method for Multi-State Path Metric Addressing," all of which are hereby incorporated herein by reference.

BACKGROUND

Forward-error-correction (FEC) communication schemes are currently used in a wide range of wireline and wireless networks such as GSM (Global System for Mobile communication), EDGE (Enhanced Data for Global Evolution), 802.xx, W-CDMA (wide-band Code-Division Multiple Access), HSDPA (High Speed Downlink Packet Access), CDMA2000, and DVB (Digital Video Broadcasting). One of the most common forward-error-correction techniques is convolutional encoding and Viterbi decoding.

A Viterbi decoder in a wireless communication device attempts to recreate the original data stream that was encoded by the convolution encoder in the transmitter. The encoded data bits are transmitted by the transmitter and received by the wireless communication device. In Viterbi decoding, path metric addressing has been a challenging engineering and non-trivial problem.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

A Viterbi decoder attempts to recreate the set of encoder state changes, or transitions, that most likely generated the output. In Viterbi decoding, the cumulative agreement of decoder inputs and the outputs of a set of recreated encoder states for a set of state changes, or path, leading to a particular recreated encoder state is called the path metric for that path. Incremental agreements for each state change, or branch, along a path are called branch metrics. Path metric addressing has been a challenging problem in Viterbi decoder design. The problem of path metric addressing becomes a nearly insurmountable problem where multi-constraint length modes are implemented in a fixed hardware platform.

Figure 1:
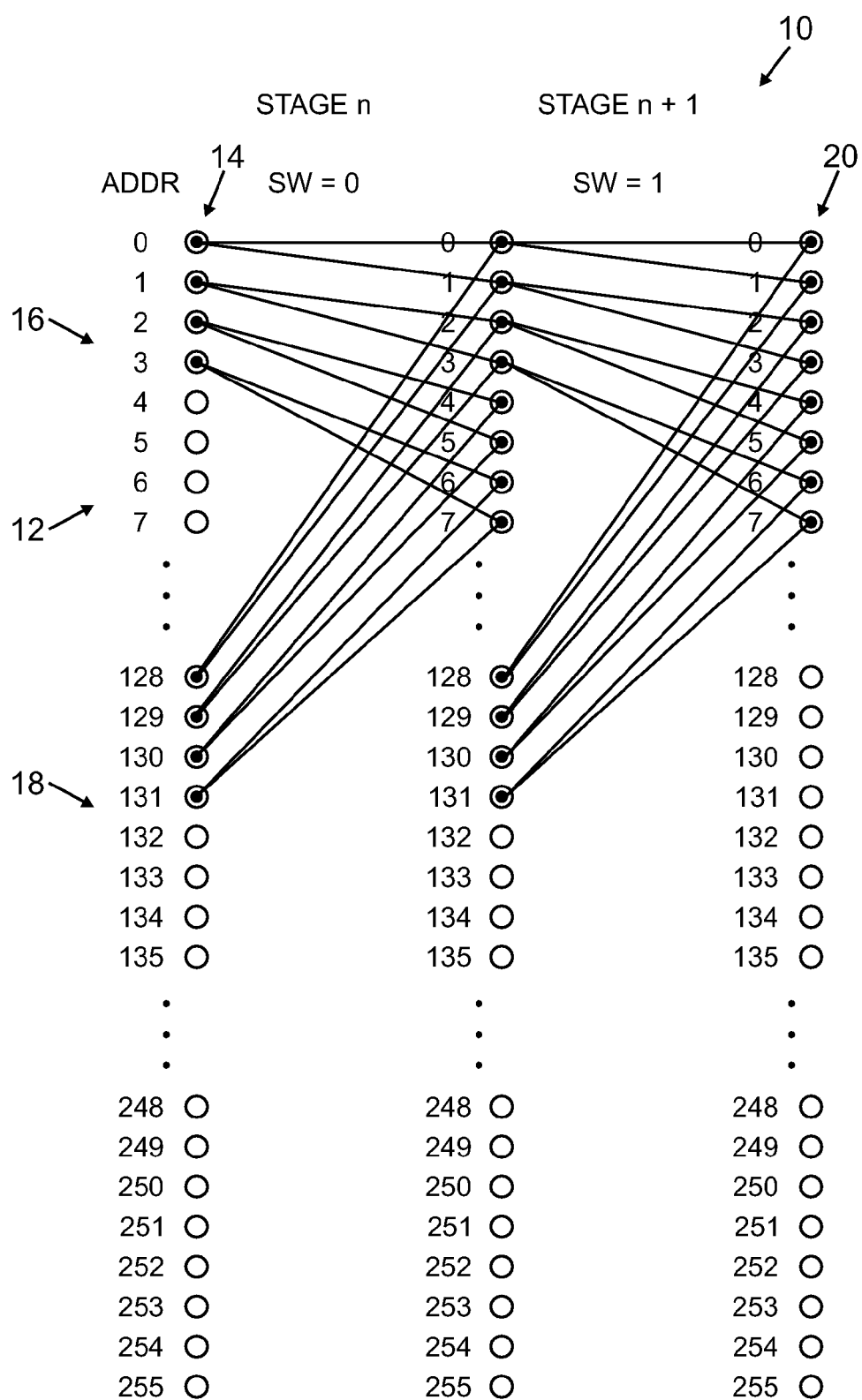
FIG. 1 is an exemplary trellis diagram.

FIG. 1 is a trellis diagram 10 that illustrates the path memory and the processing of four ACS (add-compare-select) butterflies (eight states in/eight states out) 12 in one cycle. Each ACS unit needs to be able to read eight current states (8*16 bit=128 bits) 14 from out-of-order addressing (four low states 16 and four high states 18 or in another words, 4*16 bit=64 bits from low states and 4*16 bit=64 bits from high states), to add or subtract the corresponding branch metric and write back the eight in-order states (8*16 bit=128 bits) 20 in the next stage path memory.

Figure 2:
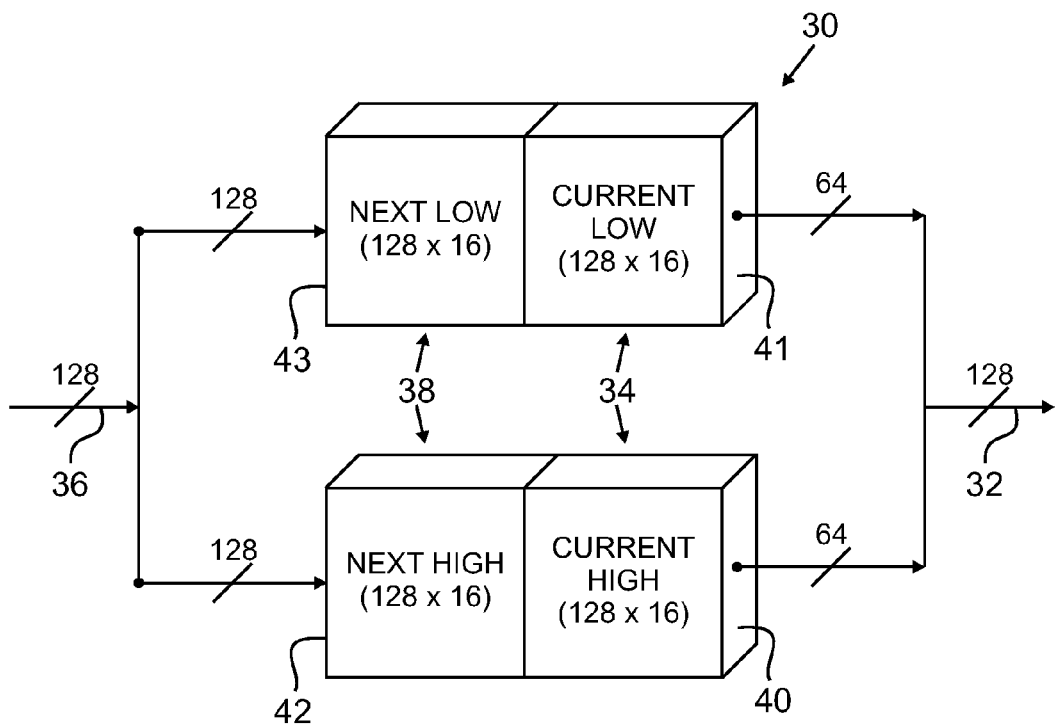
FIG. 2 is a simplified block diagram of an embodiment of a path metric addressing system.

FIG. 2 is a simplified block diagram of the path metric memory data path 30. It may be seen that 2*64 bits=128 bits 32 are read from the current stage 34 and 128 bits 36 are written to the next stage 38. The proposed solution may be comprised from four independent memory entities 40-43: current stage memory high 40, current stage memory low 41, next stage memory high 42, and next stage memory low 43. Alternatively, two memory units may be used, where one memory unit is for current stage low and next stage memory low, and the other memory unit is for current stage memory high and next stage memory high.

Figure 3:
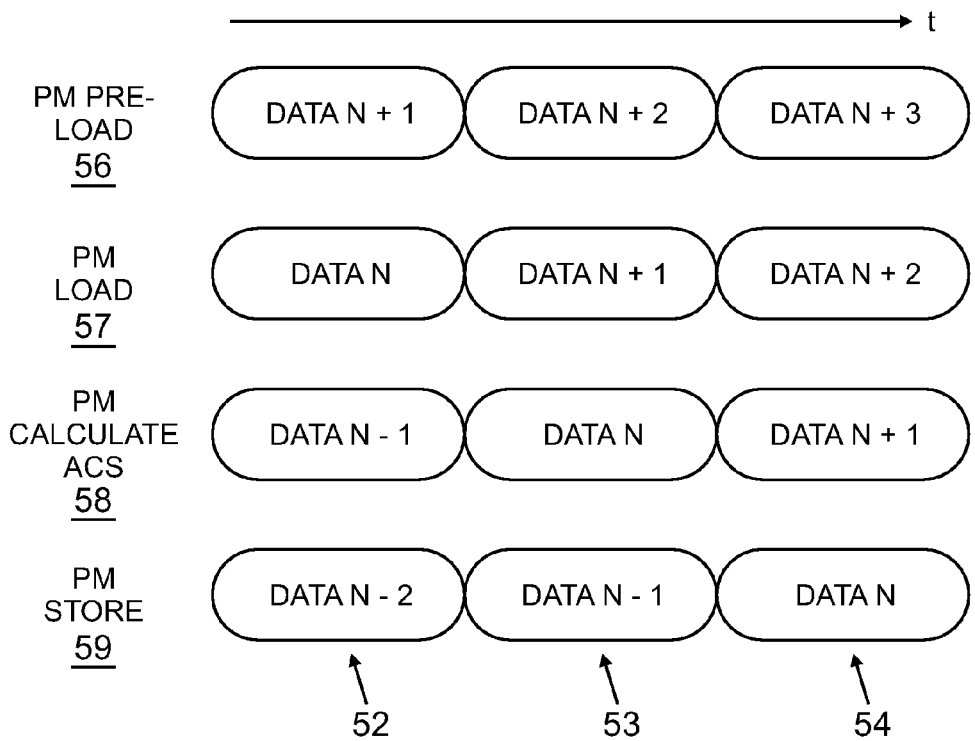
FIG. 3 is a simplified path metric pipeline diagram of the path metric addressing scheme.

FIG. 3 is a diagram of a path metric pipeline 50 that enables the processing of multi-state read/write in a single cycle. Three cycles 52-54 are shown in FIG. 3. In each cycle, four operations are performed: path metric pre-load 56, path metric load 57, path metric ACS calculation 58, and path metric store 59. In each cycle, these four operations are performed on data of four consecutive states or stages.

Figure 4A:
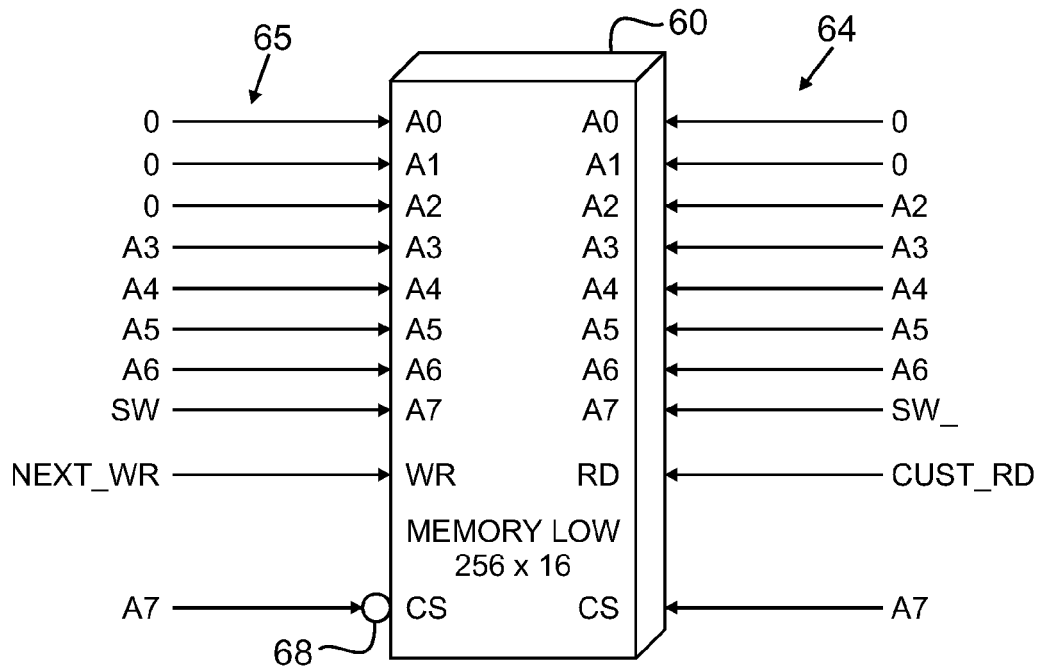
FIGS. 4-7 are simplified block diagrams of memory units used in an embodiment of the path metric addressing system and method.
Figure 4B:
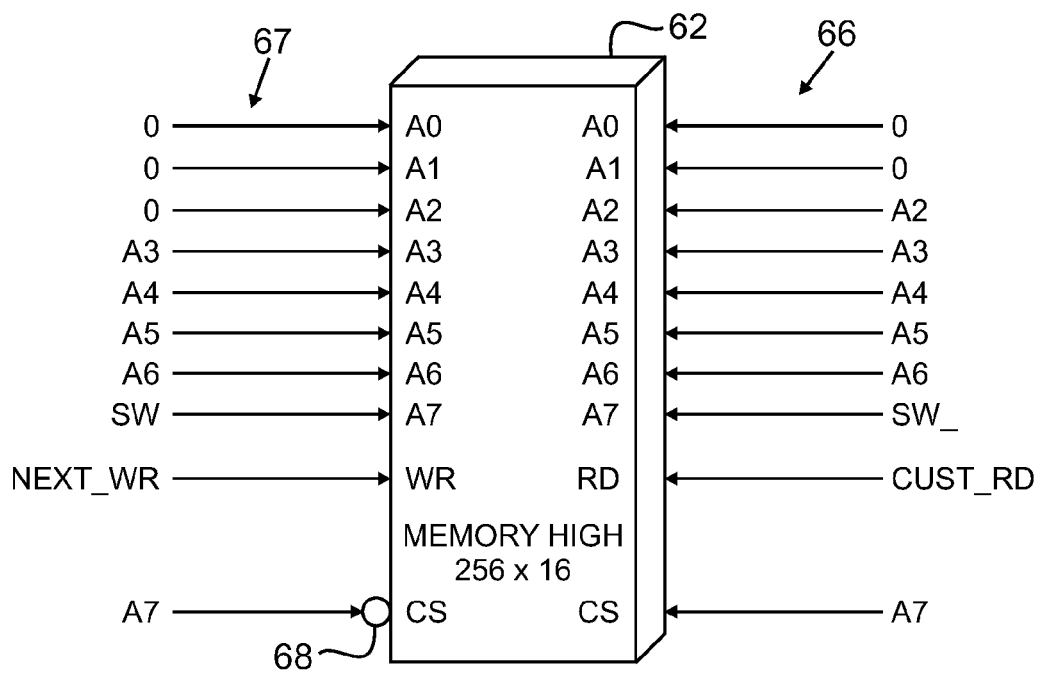

FIGS. 4A and 4B are diagrams of, respectively, memory low and memory high path metric addressing schemes and for a constraint length (CL) of nine (9) and 256 states. Two memory units 60 and 62 are used—the scheme combines the current low read with the next low write to a first memory unit 60 and combines the current high read with the next high write to a second memory unit 62. Memory units 60 and 62 are operable to receive current read address bits A7-A0 64 and 66, respectively, and next write address bits A7-A0 65 and 67, respectively. The path metric addressing mode shown in FIGS. 4A and 4B are suitable for the CDMA operating mode of the wireless communication device and other like technologies. The chip select (CS) input 68 for the memory units on the next write side for both low and high memory is set to A7 to select the low to high memory unit selection for this path metric addressing mode. The chip select input on the current read side for both low and high memory is set to one. The inputs to A0 and A1 on the current read side of the memory units are set to zero. The inputs to A0-A2 on the next write side of the memory units are also set to zero. This addressing scheme supports multiple constraint length modes while minimizing the address calculation complexity by using only two memory units.

Figure 5A:
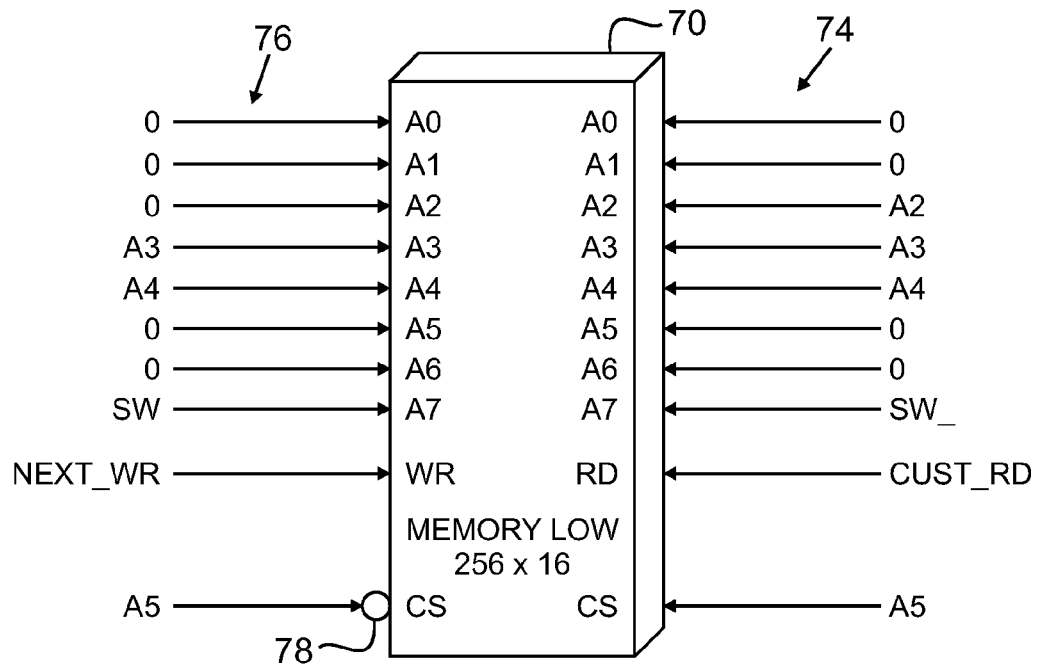
Figure 5B:
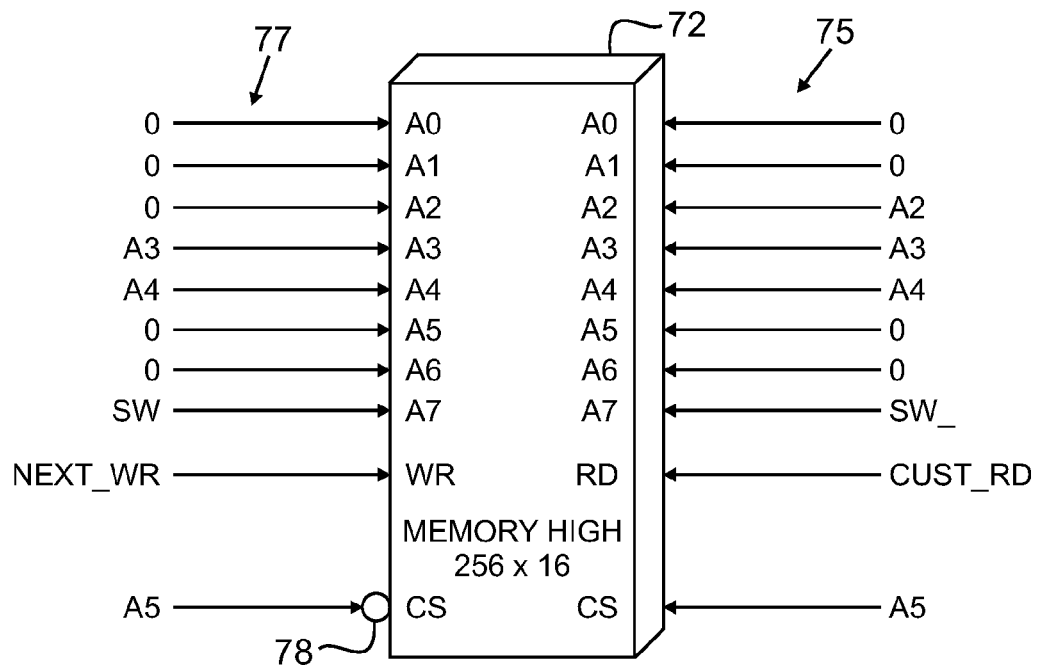

FIGS. 5A and 5B are diagrams of, respectively, memory low and memory high path metric addressing scheme for a constraint length (CL) of seven (7) and sixty-four (64). Two memory units 70 and 72 are used—the scheme combines the current low read with the next low write to a first memory unit 70 and combines the current high read with the next high write to a second memory unit 72. The memory units 70 and 72 are operable to receive current read address bits A7-A0 74 and 75, respectively, and next write address bits A7-A0 76 and 77, respectively. The path metric addressing mode shown in FIGS. 5A and 5B are suitable for the GSM operating mode of the wireless communication device and the like. The chip select (CS) input 78 for the memory units on the next write side for both low and high memory is set to A7 to select the low to high memory unit selection for this path metric addressing mode. The chip select input on the current read side for both low and high memory is set to one. The inputs to A0, A1, A5, and A6 on the current read side of the memory units are set to zero. The inputs to A0, A1, A2, A5, and A6 on the next write side of the memory units are also set to zero.

Figure 6A:
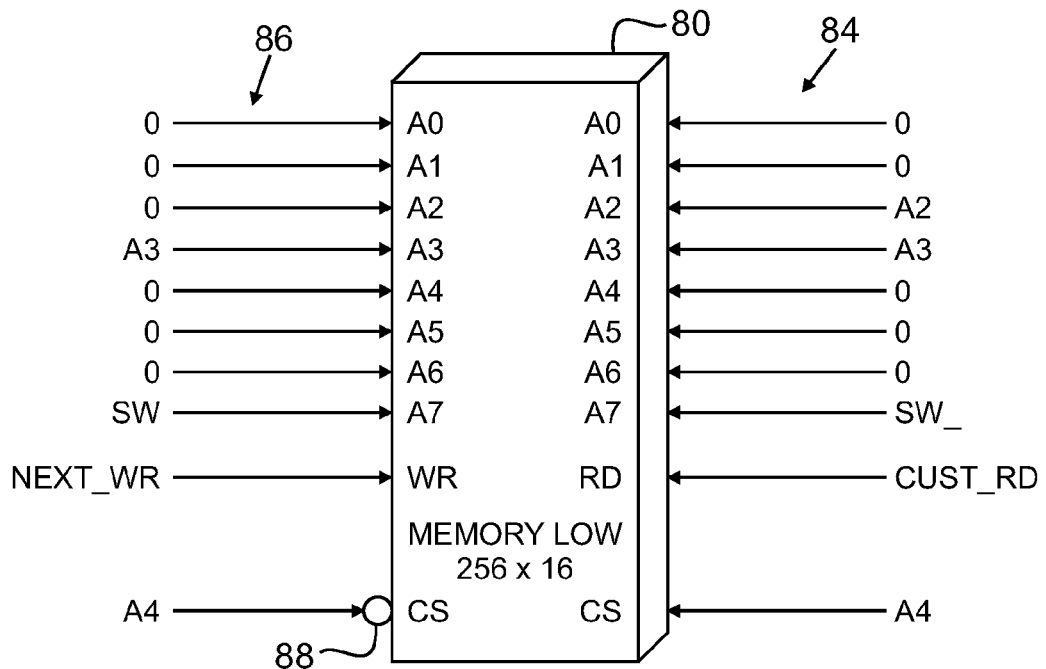
Figure 6B:
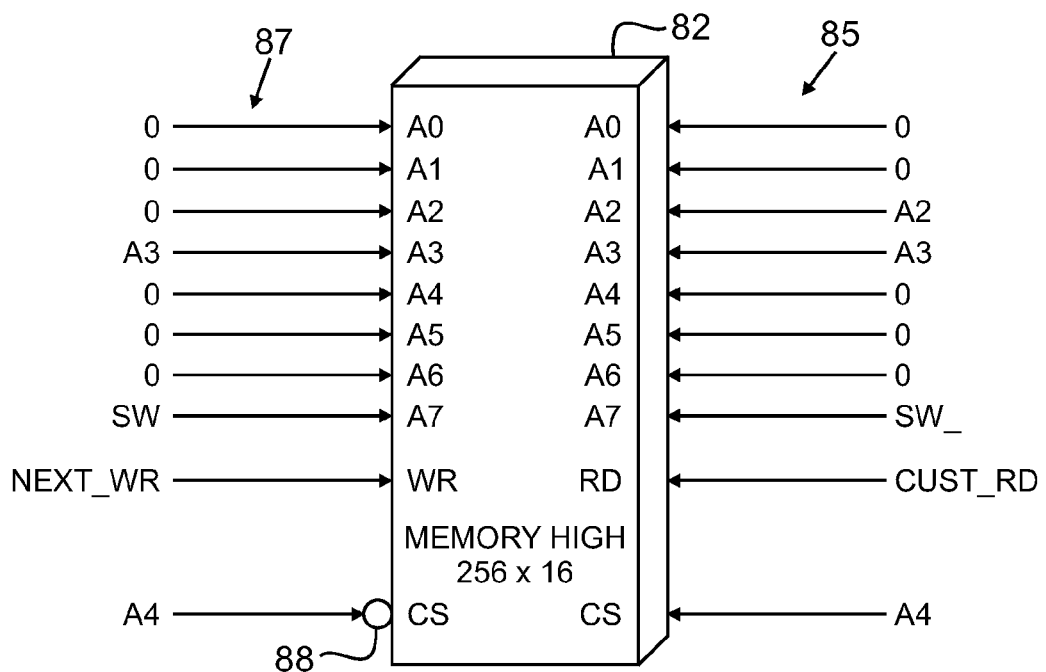

FIGS. 6A and 6B are diagrams of, respectively, memory low and memory high path metric addressing scheme for a constraint length (CL) of six (6) and thirty-two (32) states. Two memory units 80 and 82 are used—the scheme combines the current low read with the next low write to a first memory unit 80 and combines the current high read with the next high write to a second memory unit 82. The memory units 80 and 82 are operable to receive current read address bits A7-A0 84 and 85, respectively, and next write address bits A7-A0 86 and 87. The chip select (CS) input 88 for the memory units on the next write side for both low and high memory is set to A7 to select the low to high memory unit selection for this path metric addressing mode. The chip select input on the current read side for both low and high memory is set to one. The inputs to A0, A1, and A4-A6 on the current read side of the memory units are set to zero. The inputs to A0-A2 and A4-A6 on the next write side of the memory units are set to zero.

Figure 7A:
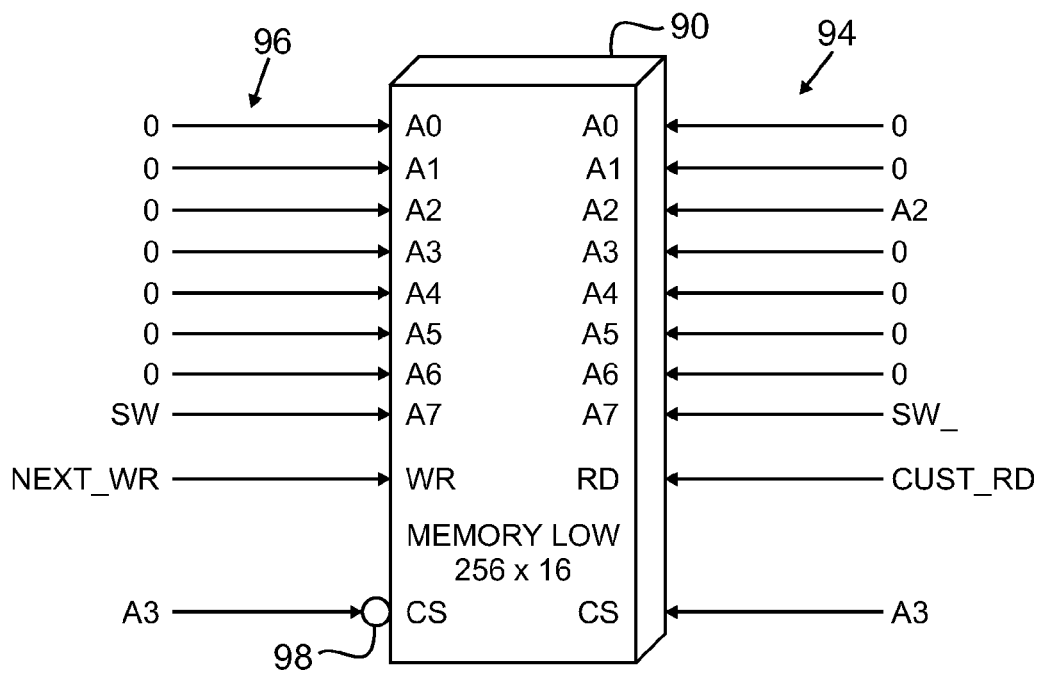
Figure 7B:
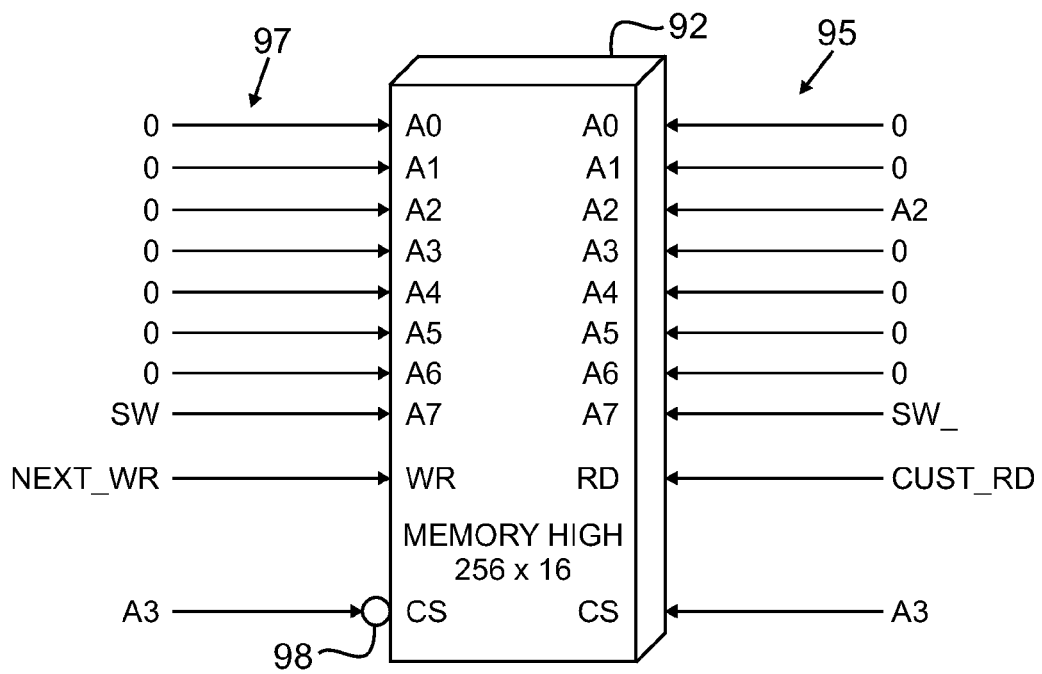

FIGS. 7A and 7B are diagrams of, respectively, memory low and memory high path metric addressing scheme for a constraint length (CL) of five (5) and sixteen (16) states. Two memory units 90 and 92 are used—the scheme combines the current low read with the next low write to a first memory unit 90 and combines the current high read with the next high read to a second memory unit 92. The memory units are operable to receive current read address bits A7-A0 94 and 95, respectively, and next write address bits A7-A0 96 and 97, respectively. The path metric addressing mode shown in FIGS. 7A and 7B are suitable for the GSM operating mode of the wireless communication device and the like. The chip select (CS) input 98 for the memory units on the next write side for both low and high memory is set to A7 to select the low to high memory unit selection for this path metric addressing mode. The chip select input on the current read side for both low and high memory is set to one. The inputs to A0, A1, and A3-A6 on the current read side of the memory units are set to zero. The inputs to A0-A6 on the next write side of the memory units are set to zero.

The proposed path metric addressing scheme reduces the logic complexity of all address inputs to the memory units to zero and selected address bits. The logic may be implemented logically by using the chip select signal as the control signal to control the address input bits. For example, if the chip select signal is A7, then A0 and A1 on the current low read side are zeros and A2-A6 are set to A2-A6 address bits; on the low next write side, A0-A2 are zero, and A3-A6 are set to A3-A6 address bits. A further reduction in complexity is that there is no address routing when the constraint length mode changes.

Figure 8:
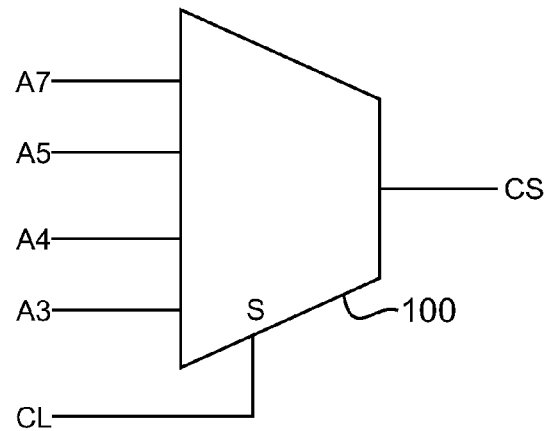
FIG. 8 is a simplified block diagram of a logic for generating a chip select for the memory units.

FIG. 8 is a logic diagram of an exemplary implementation of a logic for generating the chip select signals. A multiplexer 100 receives as its input address bits A7, A5, A4, and A3. The control signal for the multiplexer is the constraint length. For a constraint length of nine, address bit A7 is selected as the chip select signal; for a constraint length of seven, address bit A5 is selected as the chip select signal; for a constraint length of six, address bit A4 is selected as the chip select signal; for a constraint length of five, address bit A3 is selected as the chip select signal. Therefore, depending on the input to the selection signal of the multiplexer, CL, one of A7, A5, A4, and A3 is selected as the chip signal to the memory units.

Figure 9:
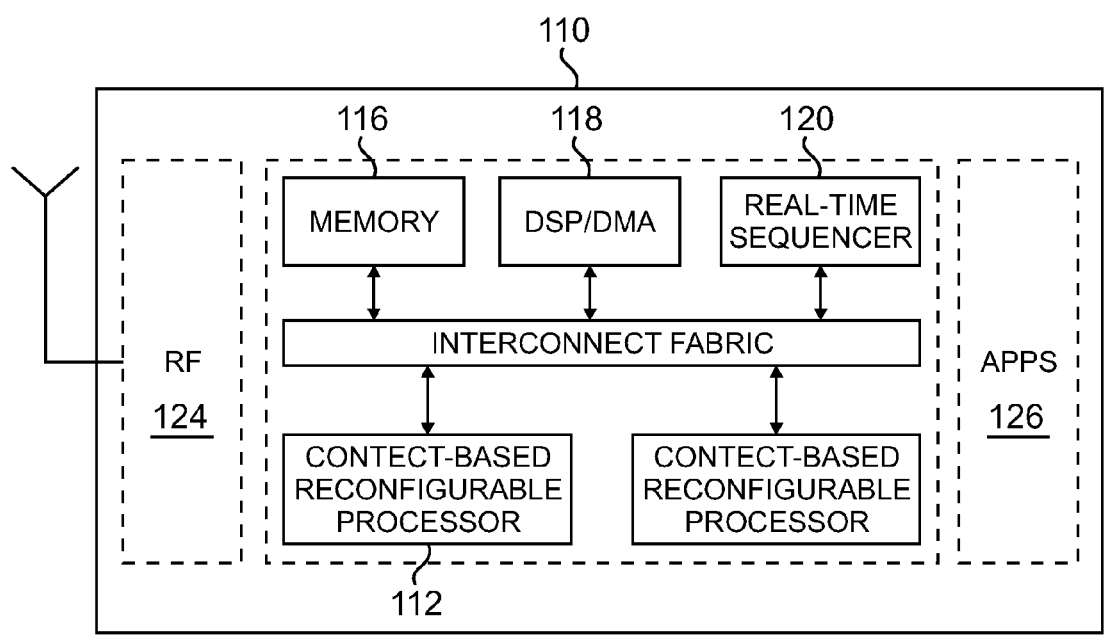
FIG. 9 is a simplified block diagram of an embodiment of a wireless communication device.

FIG. 9 is a simplified block diagram of an embodiment of a reconfigurable processing system 110 having a plurality of context-based reconfigurable processors 112-113. The reconfigurable processing system 110 is a software-defined radio (SDR) that comprises N context-based reconfigurable processors 112-113, where N is a positive integer. The context-based reconfigurable processors 112-113 are interconnected and coupled to a memory 116, a digital signal processor (DSP) and/or direct memory access (DMA) module(s) 118, and a real-time sequencer 120 via an interconnect fabric 122. Each context-based reconfigurable processor may be a specialized processor operable to focus on a particular signal processing task. For example, one context-based reconfigurable processor may be a Viterbi processor that is optimized to perform Viterbi decoding operations. Another context-based reconfigurable processor may be a correlator processor that is optimized to perform correlation processes. Yet another context-based reconfigurable processor may be a turbo code decoder that is optimized to perform forward error correction decoding. One or more of these context-based reconfigurable processors may employ the path metric addressing system and scheme described above.

Context-based reconfigurable processors 112-113 each includes generic hardware modules that execute context-related instructions in an optimized manner. Each context-based reconfigurable processor operate independently of one another under the scheduling and control of the real-time sequencer 120. One or more context-based reconfigurable processors may be independently inactivated or shut-down in applications that do not require them to optimize power consumption. The interconnect fabric 122 is reconfigurable and provides connectivity between the components in reconfigurable processing system. Each context-based reconfigurable processor may act as a master of the interconnect fabric and may initiate access to the memory.

The reconfigurable processing system 110 may be used to implement a broadband modem of a mobile phone or similar wireless communications device. The device additionally comprises an RF (radio frequency) section 124 and a plurality of applications 126 to carry out specialized functions. Because the technology and standards for wireless communications is a continuously moving target, fixed hardware architecture for mobile phones become outdated very quickly. Therefore, a software-defined context-based reconfigurable system such as the system can adapt to different technologies and standards now known and later to be developed.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A wireless communication device comprising:
   a first memory unit operable to store current and next stage memory low data of a path metric calculation of a trellis-based decoding processor;

a second memory unit operable to store current and next stage memory high data of the path metric calculation of the trellis-based decoding processor; and wherein the trellis-based decoding processor is operable for multiple decoding constraint lengths and multiple states and the first and second memory units each comprises a chip select input receiving one of A7, A5, A4, and A3 address bits dependent on a constraint length.

2. The wireless communication device of claim 1, wherein the first memory unit is operable for a current low data read operation and a next low data write operation.

3. The wireless communication device of claim 1, wherein the second memory unit is operable for a current high data read operation and a next high data write operation.

4. The wireless communication device of claim 1, wherein the first memory unit comprises a first sub-unit operable for a current low data read operation and a second sub-unit operable for a next low data write operation.

5. The wireless communication device of claim 1, wherein the second memory unit comprises a first sub-unit operable for a current high data read operation and a second sub-unit operable for a next high data write operation.

6. The wireless communication device of claim 1, wherein the first and second memory units for both low and high memory are operable to receive, on the current read stage, an input of zero for address bits AO and A1, and A2-A6 for address bits A2-A6, and on the next write stage, an input of zero for address bits AO-A2, and A3-A6 for address bits A3-A6, for a constraint length of 9.

7. The wireless communication device of claim 1, wherein the first and second memory units for both low and high memory are operable to receive, on the current read stage, an input of zero for address bits AO, A1 AS and A6, and A2-A4 for address bits A2-A4, and on the next write stage, an input of zero for address bits AO-A2, AS and A6, and A3-A4 for address bits A3 and A4, for a constraint length of 7.

8. The wireless communication device of claim 1, wherein the first and second memory units for both low and high memory are operable to receive, on the current read stage, an input of zero for address bits AO, A1 A4-A6, and A2-A3 for address bits A2-A3, and on the next write stage, an input of zero for address bits AO-A2, A4-A6, and A3 for address bit A3, for a constraint length of 6.

9. The wireless communication device of claim 1, wherein the first and second memory units for both low and high memory are operable to receive, on the current read stage, an input of zero for address bits AO, A1 A3-A6, and A2 for address bit A2, and on the next write stage, an input of zero for address bits AO-A6 for address bits AO-A6, for a constraint length of 5.

10. A method for multi-mode multi-state path metric addressing comprising:
reading current memory low data from a first memory unit of a path metric calculation of trellis-based processing;
reading current memory high data from a second memory unit;
writing next memory low data to the first memory unit;
writing next memory high data to the second memory unit;
and selecting a chip select input to the first and second memory units from A7, AS, A4 and A3 address bits depending on a constraint length.

11. The method of claim 10, wherein reading current memory low data comprises reading current memory low data from a first sub-unit of the first memory unit.

12. The method of claim 10, wherein reading current memory high data comprises reading current memory high data from a first sub-unit of the second memory unit.

13. The method of claim 10, wherein writing next memory low data comprises reading next memory low data from a second sub-unit of the first memory unit.

14. The method of claim 10, wherein writing next memory high data comprises writing next memory high data from a second sub-unit of the second memory unit.

15. The method of claim 10, further comprising providing a chip select input to the first and second memory units of A 7 for a constraint length of 9, AS for a constraint length of 7, A4 for a constraint length of 6, and A3 for a constraint length of 5.

16. The method of claim 10, further comprising providing, to the first and second memory units for both low and high memory on the current read stage, an input of zero for address bits AO and A1, and A2-A6 for address bits A2-A6, and on the next write stage, an input of zero for address bits AO-A2, and A3-A6 for address bits A3-A6, for a constraint length of 9.

17. The method of claim 10, further comprising providing, to the first and second memory units for both low and high memory on the current read stage, an input of zero for address bits AO, A1 AS and A6, and A2-A4 for address bits A2-A4, and on the next write stage, an input of zero for address bits AO-A2, AS and A6, and A3-A4 for address bits A3 and A4, for a constraint length of 7.

18. The method of claim 10, further comprising providing, to the first and second memory units for both low and high memory on the current read stage, an input of zero for address bits AO, A1 A4-A6, and A2-A3 for address bits A2-A3, and on the next write stage, an input of zero for address bits AO-A2, A4-A6, and A3 for address bit A3, for a constraint length of 6.

19. The method of claim 10, further comprising providing, to the first and second memory units for both low and high memory on the current read stage, an input of zero for address bits AO, A1 A3-A6, and A2 for address bit A2, and on the next write stage, an input of zero for address bits AO-A6 for address bits AO-A6, for a constraint length of 5.

20. A wireless communication device comprising:
a context-based reconfigurable processor;
a first memory unit operable to store current and next stage memory low data of multistate multi-mode path metric calculation of a trellis-based decoding processing; and
a second memory unit operable to store current and next stage memory high data of the path metric calculation of the trellis-based decoding processor.

21. The wireless communication device of claim 20, wherein the first memory unit is operable for a current low data read operation and a next low data write operation.

22. The wireless communication device of claim 20, wherein the second memory unit is operable for a current high data read operation and a next high data write operation.

23. The wireless communication device of claim 20, wherein the first memory unit comprises a first sub-unit operable for a current low data read operation and a second sub-unit operable for a next low data write operation.

24. The wireless communication device of claim 20, wherein the second memory unit comprises a first sub-unit operable for a current high data read operation and a second sub-unit operable for a next high data write operation.

25. The wireless communication device of claim 20, wherein the first and second memory units each comprises a chip select input receiving one of A 7, A5, A4, and A3 address bits dependent on a constraint length.

26. The wireless communication device of claim 20, wherein the first and second memory units for both low and high memory are operable to receive, on the current read stage, an input of zero for address bits AO and A1, and A2-A6 for address bits A2-A6, and on the next write stage, an input of zero for address bits AO-A2, and A3-A6 for address bits A3-A6, for a constraint length of 9.

27. The wireless communication device of claim 20, wherein the first and second memory units for both low and high memory are operable to receive, on the current read stage, an input of zero for address bits AO, A1 A5 and A6, and A2-A4 for address bits A2-A4, and on the next write stage, an input of zero for address bits AO-A2, A5 and A6, and A3-A4 for address bits A3 and A4, for a constraint length of 7.

28. The wireless communication device of claim 20, wherein the first and second memory units for both low and high memory are operable to receive, on the current read stage, an input of zero for address bits AO, A1 A4-A6, and A2-A3 for address bits A2-A3, and on the next write stage, an input of zero for address bits AO-A2, A4-A6, and A3 for address bit A3, for a constraint length of 6.

29. The wireless communication device of claim 20, wherein the first and second memory units for both low and high memory are operable to receive, on the current read stage, an input of zero for address bits AO, A1 A3-A6, and A2 for address bit A2, and on the next write stage, an input of zero for address bits AO-A6 for address bits AO-A6, for a constraint length of 5

\* \* \* \* \*

UNITED STATES PATENT AND TRADEMARK OFFICE
CERTIFICATE OF CORRECTION

PATENT NO. : 7,496,827 B2 Page 1 of 1
APPLICATION NO. : 11/317448
DATED : February 24, 2009
INVENTOR(S) : Eran Pisek It is certified that error appears in the above-identified patent and that said Letters Patent is hereby corrected as shown below:

Column 8, line 11, claim 29, insert --.-- after "5".

Signed and Sealed this

Twenty-third Day of March, 2010

David J. Kappos
*Director of the United States Patent and Trademark Office*